(12) United States Patent
DeHaven et al.

(10) Patent No.: US 6,361,627 B1
(45) Date of Patent: Mar. 26, 2002

(54) PROCESS OF CONTROLLING GRAIN GROWTH IN METAL FILMS

(75) Inventors: Patrick W. DeHaven; Charles C. Goldsmith, both of Poughkeepsie; Jeffery L. Hurd, deceased, late of Marlboro, by Kathleen Reese, administratrix; Suryanarayana Kaja, Hopewell Junction; Michele S. Legere, Walden; Eric D. Perfecto, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/569,483

(22) Filed: May 11, 2000

Related U.S. Application Data

(62) Division of application No. 09/095,253, filed on Jun. 10, 1998, now Pat. No. 6,126,761.

(51) Int. Cl.$^7$ .................................................. C12D 6/04
(52) U.S. Cl. ........................ 148/517; 148/518; 148/577; 205/223; 205/224
(58) Field of Search .............................. 148/517, 516, 148/577; 205/220, 223, 224

(56) References Cited

U.S. PATENT DOCUMENTS

| | | | |
|---|---|---|---|
| 3,092,967 A | | 6/1963 | Guess ........................ 205/926 |
| 3,185,600 A | * | 5/1965 | Dullberg ..................... 148/577 |
| 4,083,220 A | * | 4/1978 | Kobayashi et al. ......... 148/577 |
| 4,576,689 A | | 3/1986 | Markaev et al. ............ 205/224 |
| 5,361,968 A | * | 11/1994 | Tanaka et al. .............. 148/517 |

FOREIGN PATENT DOCUMENTS

SU 1650763 * 5/1991 ................. 148/517

OTHER PUBLICATIONS

J. W. Patten, E. D. McClanahan, J. W. Johnston, Room–Temperature Recrystallization in Thick Bias–Sputtered Copper Deposite, *Journal of Applied Physics,* vol. 42, No. 11, pp 4371–4377.

(List continued on next page.)

*Primary Examiner*—George Wyszomierski
(74) *Attorney, Agent, or Firm*—Ratner & Prestia; Tiffany L. Townsend, Esq.

(57) ABSTRACT

A process for controlling grain growth in the microstructure of thin metal films (e.g., copper or gold) deposited onto a substrate. In one embodiment, the metal film is deposited onto the substrate to form a film having a fine-grained microstructure. The film is heated in a temperature range of 70–100°C. for at least five minutes, wherein the fine-grained microstructure is converted into a stable large-grained microstructure. In another embodiment, the plated film is stored, after the step of depositing, at a temperature not greater than −20° C., wherein the fine-grained microstructure is stabilized without grain growth for the entire storage period.

9 Claims, 3 Drawing Sheets

OTHER PUBLICATIONS

"Metals Handbook," vol. 4, pp. 719–728 (9th ed., American Society for Metals, Metals Park, Ohio, 1981).

B.D. Cullity, "Elements of X–Ray Diffraction," pp. 281–323 (2d ed., Addison–Wesley, Reading, Massachusetts, 1978).

Chee C. Wong, Henry I. Smith, and C.V. Thompson, Surface–Energy–Driven Secondary Grain Growth In Tin Au Films, *Journal of Applied Physics Lett.* vol. 48, No. 5, pp 335–337 (Feb. 1986).

R.E. Acosta, I. Babich, P. Blauner, and A. Wagner, Electrodeposited Gold: Real Time Stress and Structural Change at Room Temperature, *Materials Research Society*, vol. 306, pp. 265–274 (1993).

G.K. Celler, J.R. Maldonado, Materials Aspects of X–Ray Lighography, Materials Research Society Symposium Proceedings, Vo. 306, Apr. 1993.

D. Winau, R. Koch, M. Weber, K.H. Rieder, Intrinsic Stress of Ag Au Electrical Contact Films for High Temperature Superconductor Thin Films, American Institute of Physics Appl. Physics. Lett. 61, Jul 1992.

C.C. Wong, H.I. Smith, C.V. Thompson, Surface–Energy–Driven Secondary Grain Growth in Thin Au Films, Appl. Phys. Letter 48, Feb. 1986.

C.R. Aita, K.S. SreeHarsha, Thin Films: The Relationship of Structure to Properties, Materials Research Society, Symposia Proceedings, Vo. 47, Apr. 1985.

Young, D.B.F., et al., "The Deposition of Copper from Phosphoric Acid Solutions," *Metal Finishing,* pp.56–59, Nov. 1949.

Lamb, V.A., et al., "Physical and Mechanical Properties of Electrodeposited Copper," *J. of the Electro–Chemical Society,* pp. 381C–403C, Nov. 1970.

* cited by examiner

PROCESS OF CONTROLLING GRAIN GROWTH IN METAL FILMS

This application is a divisional of U.S. patent application Ser. No. 09/095,253, filed on Jun. 10, 1998, which has been allowed as U.S. Pat. No. 6,126,761.

TECHNICAL FIELD

The present invention relates, in general, to the process of making thin film depositions on a substrate and, more specifically, to a process for controlling the grain structure growth of a thin metal film after having been deposited on a substrate.

BACKGROUND OF THE INVENTION

A large variety of thin films are used in the fabrication of very large scale integrated circuit devices. These films may be thermally grown or deposited on a substrate. The thin films may be metals, semiconductors, or insulators.

There are several techniques for depositing films on a substrate. One such technique may be performed in a vacuum chamber and is known as physical vapor deposition or sputtering. Another technique may be performed in a bath and is known as electroplating.

It is known that sputter deposited copper films have a characteristic as-deposited microstructure which changes as a function of time at room temperature. This phenomenon has been documented by J. W. Patten et al. in "Room Temperature Recrystallization in Thick Bias Sputtered Copper Deposits," Journal of Applied Physics, vol. 42, No. 11, pages 4371–77 (October 1971).

Work has shown that, for electroplated copper, the as-plated copper has a fine-grained microstructure, with an average crystallite size of less than 100 nanometers. Verification of this microstructure in the as-plated film has been established using Back-Scattered Kikuchi Diffraction (BKD). When stored at room temperature, no change has been observed in the fine-grained microstructure for a period of 8–10 hours; this time period is known as the incubation period. After the incubation period, grain growth has been observed for the next 10–20 hours, with the microstructure then reaching an apparent steady-state having an equilibrium structure.

In order to take advantage of the fine-grained microstructure of copper, certain critical process steps must be carried out within 20 hours after copper electroplating. This requirement is difficult to meet in a manufacturing environment in which, for example, the as-deposited substrate may sit on a shelf over the weekend.

It is also known that grain growth in the microstructure of copper may be accomplished within the space of several minutes by heating the copper at a high temperature. Heating a metal to change its microstructure is an established metallurgical practice. It has been believed, however, that for a metal such as bulk copper, a relatively high temperature of at least 350° C. is required to obtain any appreciable change in its microstructure. This has been documented in "Metals Handbook," Vol. 4, pages 719–28 (9th ed., American Society for Metals, Metals Park, Ohio, 1981).

Several semiconductor manufacturers are replacing the current aluminum interconnect metallization with copper wiring, because copper offers superior electrical conductivity and electromigration performance. Several deposition techniques are possible, one of these being electroplating. Electroplating has advantages: it has excellent trench fill properties and produces a copper film with near zero residual stress.

Electroplated copper interconnects may be used in multichip modules for both power distribution and signal transmission. In the more complex structures, multiple levels of wiring may be required. The fabrication of these wiring levels is well known in the art. The grain structure of the plated copper is critical. If the plated copper has a fine-grained microstructure, the etching results in a smooth surface. If the plated copper has a large-grained microstructure, however, the etching results in a rough surface. The rough surface has a disadvantage because such a surface precludes an accurate measure of the thickness of the polyimide layer which is deposited over the wiring.

The deficiencies of the conventional processes used to deposit thin metal films on a substrate show that a need still exists for a process which can control the grain structure growth of a thin metal film after the film has been deposited on a substrate.

SUMMARY OF THE INVENTION

To meet this and other needs, and in view of its purposes, the present invention provides a process of depositing thin metal films having different microstructures onto a substrate. The process controls grain growth in the microstructures and, in one embodiment, includes the following steps:

(a) a metal film is deposited onto the substrate to form a film having a fine-grained microstructure, and (b) the metal film is heated in a temperature range of 70–100° C., for at least five minutes, to convert the fine-grained microstructure into a stable, large-grained microstructure.

In another embodiment, the metal film is frozen, after the step (a) of depositing, at a temperature not greater than −20° C., wherein the fine-grained microstructure is stabilized without grain growth for the entire freezing period.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Electroplated copper films have a characteristic microstructure when immediately removed from a plating bath. This microstructure is hereinafter referred to as a "Type A" microstructure. The Type A microstructure is fine-grained, with an average crystallite size of less than 100 nanometers. Verification of the fine-grained structure in the as-plated film has been established using Back-Scattered Kikuchi Diffraction (BKD).

No change has been observed in the structure for a period of 8–10 hours; this time may be termed the incubation period. After the incubation period, grain growth has been observed for the next 10–20 hours, with the microstructure then reaching an apparent equilibrium structure, or steady state. This new microstructure is hereinafter referred to as a Type B microstructure. The Type B microstructure has large grains, with an average crystallite size greater than 1,000 nanometers.

If Type A copper is allowed to remain at room temperature (approximately 25° C.) for a period of at least 24 hours, it will be converted to Type B copper. Type B copper can be held at room temperature for extended periods of time (more than 30 days) without change in the microstructure.

Figure 1:
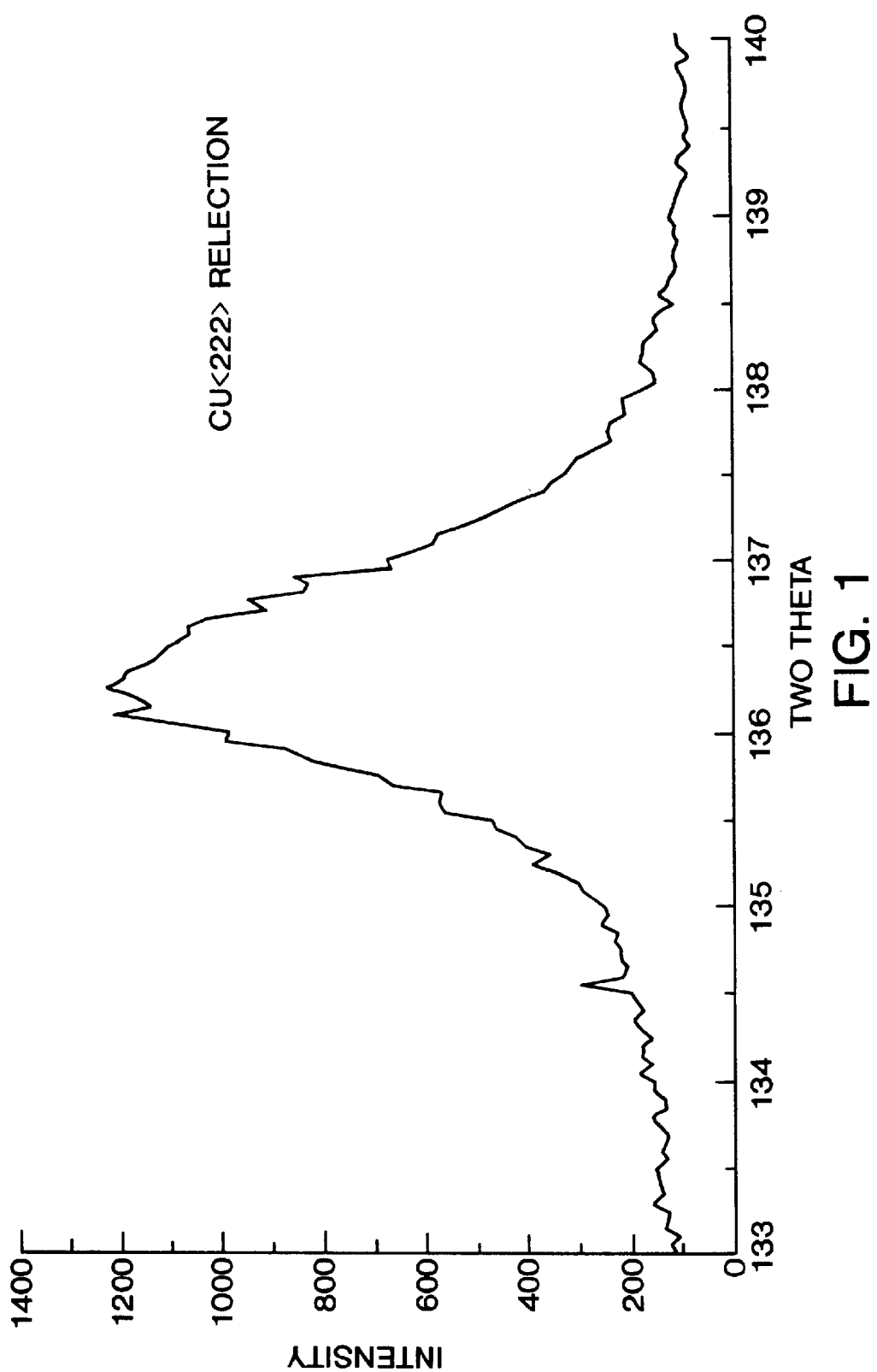
FIG. 1 is an x-ray diffraction scan of an electroplated copper film with a fine-grained microstructure.
Figure 2:
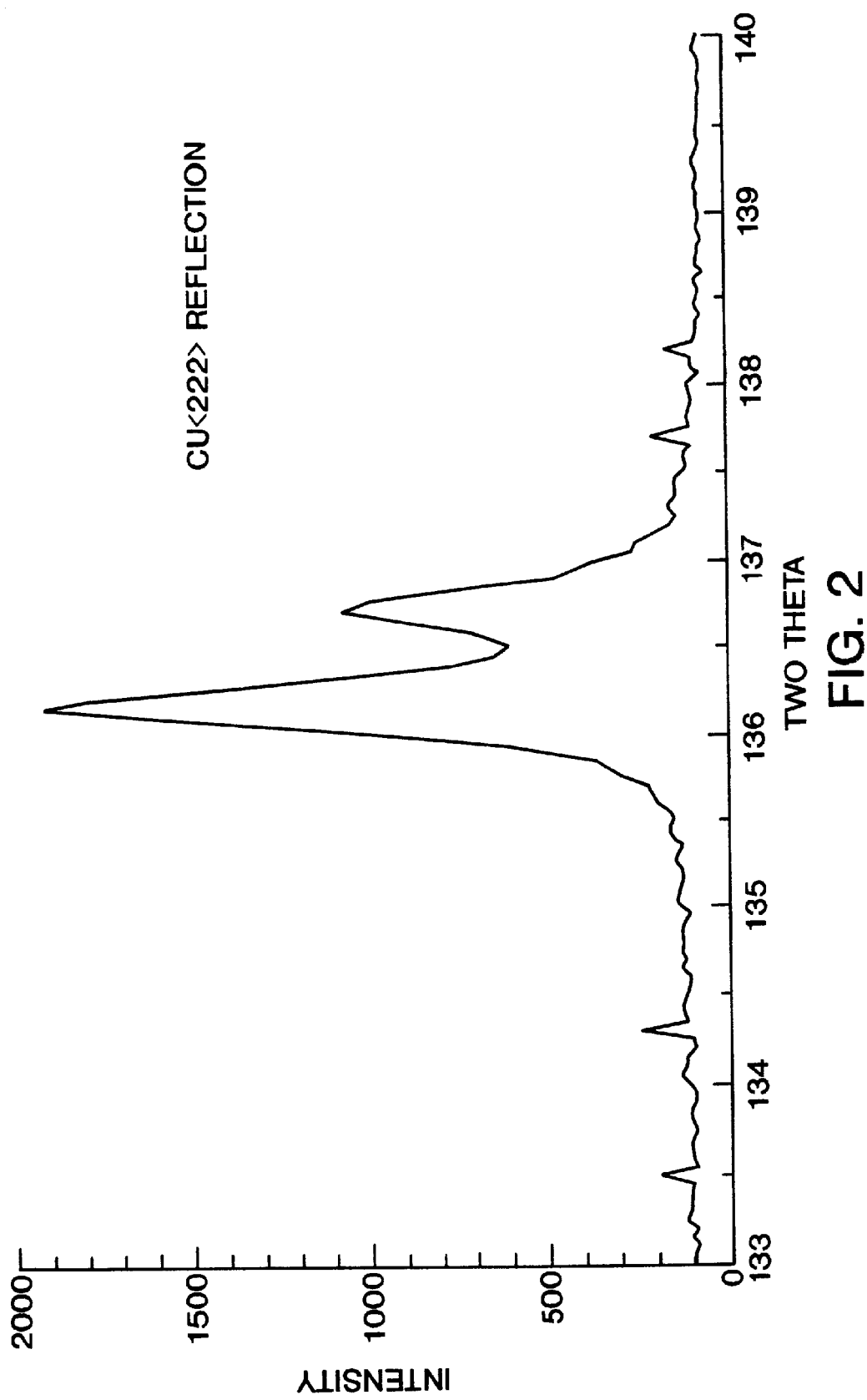
FIG. 2 is an x-ray diffraction scan of an electroplated copper film with a large-grained microstructure.

X-ray diffraction scans of electroplated copper films with Type A and Type B microstructures are shown in FIG. 1 and FIG. 2, respectively. The scan in FIG. 1 was taken 30 minutes after removal of the copper film from the plating bath. The scan in FIG. 2 was taken approximately 45 hours after removal from the plating bath. The copper film was held at room temperature for the entire duration of the experiment.

As shown in the figures, a Type A microstructure may be characterized by a large coherent diffracting domain which produces a very broad peak in an x-ray diffraction pattern. A Type B microstructure produces narrow peaks in an x-ray diffraction pattern relative to a Type A microstructure. A good reference for x-ray diffraction techniques used to characterize polycrystalline materials, such as copper, is B. D. Cullity, "Elements of X-Ray Diffraction," pages 281–323 (2d ed., Addison-Wesley, Reading, Mass. 1978).

The initiation of the transformation from Type A to Type B copper may be delayed for an extended period of time (at least 92 hours) by placing the copper in a controlled temperature environment at a temperature of −20° C. or lower. Moreover, the conversion from Type A to Type B copper may be accomplished within the space of several minutes by heating the copper at a low temperature (greater than 60° C. but less than 100° C.).

This rapid conversion of plated copper film from Type A into type B is unexpected. As mentioned earlier, it has been thought that a metal such as bulk copper must be heated to at least 350° C. in order to obtain any appreciable change in its microstructure.

The inventors measured the rate of transformation of Type A to Type B copper using in-situ, high-temperature, x-ray diffraction techniques. The table below lists the times to complete the transformation at room temperature for plated copper which had been heated previously at various temperatures from 25° C. to 60° C.

TABLE 1

Transformation of Cooper
From Type A to Type B

| Storage Temperature in Degrees Centigrade | Time to Complete Transformation in Hours |
| --- | --- |
| 25 | 30 |
| 40 | 3.5 |
| 50 | 1.2 |
| 60 | 0.19 |

Figure 3:
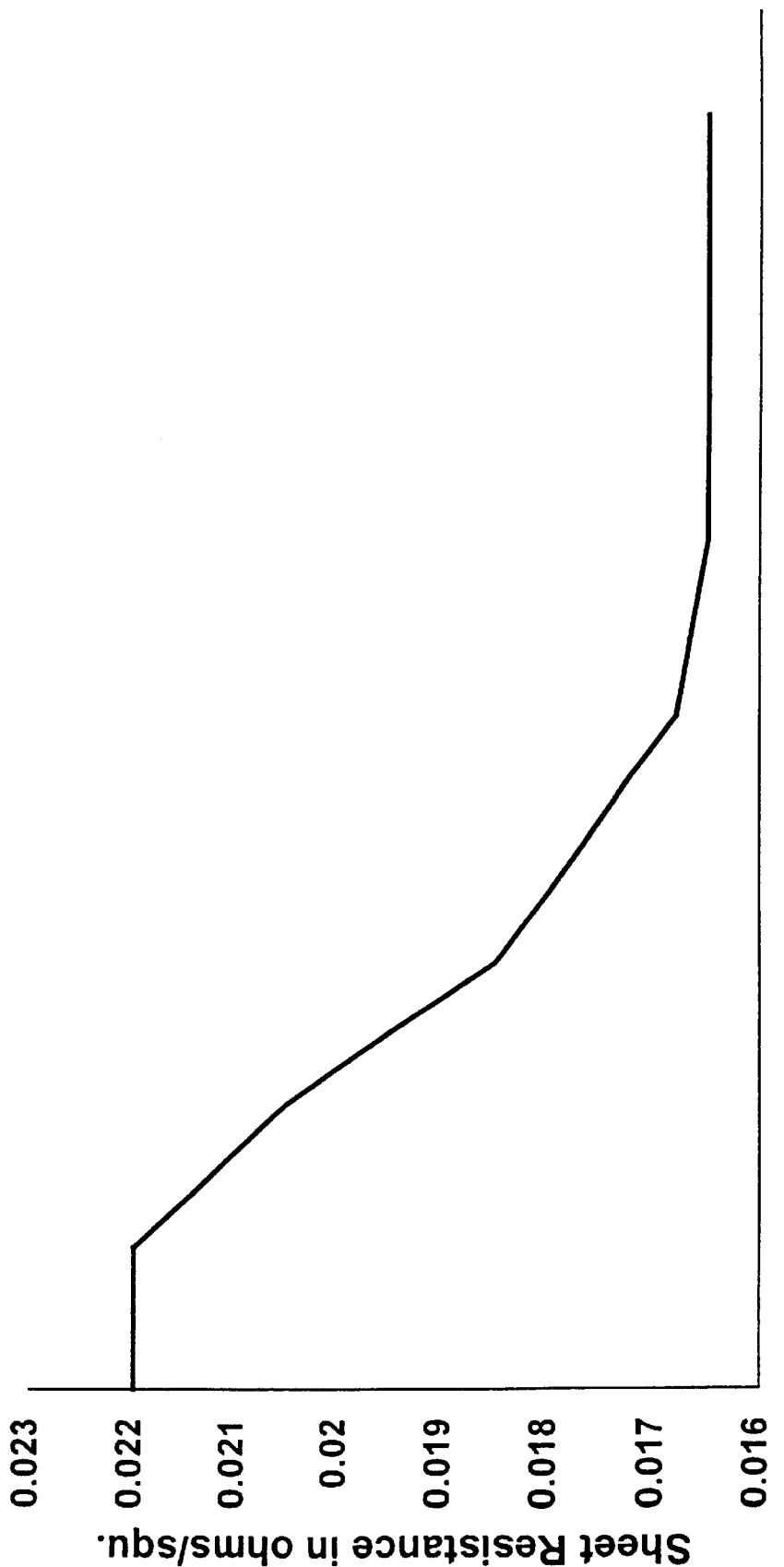
FIG. 3 is a schematic plot of sheet resistance versus time for an electroplated copper film removed from the plating bath.

J. W. Patten et al. teach that the resistance of sputtered copper changes as a function of time while the copper is held at room temperature. Thus, resistance may be used as an alternative to x-ray diffraction as a monitor of the copper transformation. FIG. 3 is a schematic illustration of the variation in sheet resistance of a blanket copper film. The plot consists of an initial high resistance state, which corresponds to the Type A microstructure. After a period of time, the resistance drops until it reaches a final steady state, which corresponds to the Type B microstructure. The time required to reach the final steady state as well as the time before the transformation occurs (termed the "incubation period") depend on factors such as the deposition technique, thickness of the copper film, and temperature at which the film is held after deposition.

It is desirable, of course, to use plated copper with a low resistance in the chip or chip carrier when making wires because resistance is critical to the performance of the copper wire. It may also be desirable to plate copper with a fixed sheet resistance in order to obtain a specific resistance for the as-plated copper film.

It will be understood that the time to complete transformation of the as-deposited copper film from Type A to Type B may be shortened dramatically (as shown in Table 1) and, consequently, so may be the time to decrease the sheet resistance of the plated copper film.

A process has thus been found to produce a copper film with a steady and stable large-grained microstructure (Type B) which has a lower sheet resistance than the original as-deposited copper film. A preferred process includes rinsing the substrate immediately after copper plating. The rinsing step is done with hot deionized water having a temperature of at least 70° C., but not more than 100° C., for a time not less than five minutes. The preferred process relies on the fact that the grain growth has been shown by the inventors to be a purely kinetic process.

This process has been verified in experiments with good results. Wafers 100 mm in diameter with five microns of electroplated copper film have been processed using 70° C. deionized water rinse and shown to have achieved a large-grained equilibrium state (Type B).

Various other approaches have also been taken, such as (1) furnace annealing after plating, and (2) plating additives into the substrate. Furnace annealing after plating has been successful. The preferred process is superior over furnace annealing, however, in that it can readily be integrated into the plating assembly line.

The preferred process thus provides an approach by which the conversion of a Type A microstructure into a Type B microstructure may be accelerated. This acceleration is accomplished by heating the plated substrate at a temperature below 100° C. The degree of acceleration will be dependent on the temperature selected. For example, an electroplated copper film, placed in a tank of deionized water held at 70° C. for at least five minutes, will convert from a Type A microstructure to a Type B microstructure.

It will be understood that furnace annealing may also be a process in which the conversion of a Type A microstructure into a Type B microstructure may be accelerated. Again, this acceleration may be accomplished by heating the as-plated substrate in an oven at a temperature below 100° C. The degree of acceleration will depend on the temperature selected. For example, an electroplated copper film, placed in an oven held at 70° C. for at least five minutes, will convert from a Type A microstructure to a Type B microstructure.

Furthermore, because the grain growth in a plated metal appears to be kinetically driven, a process has been found to slow or prevent grain growth. Stated differently, a process has been found to slow or prevent the initiation of the conversion of a Type A plated film. This process may be accomplished by maintaining the as-deposited metal film at a temperature below that of room temperature. The extent of the delay will depend on the temperature selected. For maintaining copper metal at −20° C. will delay the initiation of the conversion for a period of at least 30 days.

The aforementioned process has been found useful in the process of fabricating electroplated copper interconnects or wires in a substrate. As previously mentioned, the grain structure of the plated copper is critical during the etching process. If the plated copper has a fine-grained microstructure, the etching results in a smooth surface. If the plated copper has a large-grained microstructure, however, the etching results in a rough surface. The rough surface has disadvantages.

The inventors have found that the roughening of the copper may be due to room temperature grain growth. The grain growth may result in large grains of copper with different crystallographic planes oriented to the surface. These planes may etch at different rates during the etching process, thereby resulting in rough copper. This rough copper may also form etch pits. The etch pits may make for an undesirable metal interface topography with any subsequent metal layers. The etch pits may further tend to trap process waste and debris and thereby contaminate the metal-to-via interface as well. This interface may open electrically after thermal cycling, resulting in low production yield and in-field reliability problems.

It has been observed that, if the etching is performed immediately after plating, the resulting copper may have a smooth surface texture. Such a surface will permit an accurate measure of the thickness of the polyimide overlayer and will form a good metallurgical bond to a connecting via. From a manufacturing vantage, however, the etching cannot be performed immediately. A delay of 24 hours may be an absolute minimum and a delay of 72 hours (over a weekend) may be required for routine manufacturing conditions.

Therefore, in order to obtain uniform properties and behavior, it is desirable to stabilize the copper microstructure prior to subsequent process steps. The process by which this result may be accomplished is to refrigerate the substrate immediately after plating until the manufacturing line is ready to etch the seed layer.

The following experiment was performed. A 5-micron thick copper film was plated on a 100 mm Si wafer using the tool for substrate copper plating. The wafer was quartered immediately after plating. One quarter was used as a control and held at room temperature for 24 hours, while the other three quarters were placed in a commercial freezer and held at −20° C. The three samples placed in the freezer were removed from the freezer at 24-hour intervals. X-ray diffraction scans showed that the control sample had a Type B microstructure while the three frozen samples had Type A microstructures. No grain growth was observed in the frozen samples. Thus, a process has been found to prevent the initiation of conversion of a Type A microstructure before etching by maintaining the as-deposited metal film at a temperature below −20° C. until the manufacturing or assembly line is ready to perform the etching process.

The present invention also provides yet another process in which an intermediate microstructure, hereinafter referred to as a Type C microstructure, may be obtained. It will be understood that a Type C microstructure is one which has a grain size greater than that of a Type A microstructure, but less than that of a Type B microstructure.

A Type C microstructure may be obtained in a two-step process. Step 1 of the process consists of heating the as-deposited metal film at a temperature below 100° C. while monitoring the change in its microstructure by a temperature-independent technique, such as x-ray diffraction or sheet resistance measurements. Once the desired microstructure is reached, Step 2 may be performed. Step 2 consists of immediately reducing the temperature of the partially transformed metal film to a value no greater than −20° C. The film may be kept in the freezer until it is ready for the next step in the assembly line, such as etching.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to only copper films. Rather, the invention may be extended to other metals beyond copper. Room temperature grain growth has been reported in gold films. This report suggests that one may extend the invention to gold films and, possibly, to all Group IB metals.

It will be further understood that the present invention may be extended to any deposition process for metal films. As such, the deposition may be by way of electroplating techniques in a bath or by sputtering techniques in a vacuum.

What is claimed:

1. A process for controlling grain growth in the microstructure of thin meal films deposited onto a semiconductor substrate, the process comprising the steps of:
    (a) depositing a metal film onto the semiconductor substrate to form a film having a fine-grained microstructure of an average crystallite size less than 0.1 micron, and
    (b) storing the metal film and the semiconductor substrate at a temperature not greater than −20° C., wherein the fine-grained microstructure is stabilized without grain growth for the entire storage period.

2. The process of claim 1 wherein the metal film is one of copper and gold.

3. The process of claim 2 wherein the depositing step includes electroplating the metal film onto the substrate.

4. The process of claim 1 wherein storing the metal film includes storing the metal film for at least a 24-hour interval.

5. In the formation of multi-layered wiring on a substrate, a process for controlling grain growth in the wiring comprising the steps of:
    (a) depositing a seed layer onto the substrate,
    (b) depositing a metal film onto the seed layer to form a film having a fine-grained microstructure,
    (c) storing the metal film at a temperature not greater than −20° C., and
    (d) etching the metal film immediately after the step of storing, wherein the fine-grained microstructure is stabilized without grain growth.

6. The process of claim 5 wherein the metal film is one of copper and gold.

7. The process of claim 6 wherein the seed layer is a layer of copper less than 200 nanometers thick.

8. A process for controlling grain growth in the microstructure of thin metal films deposited onto a substrate, the process comprising the steps of:
    (a) depositing a metal film onto the substrate to form a film having a fine-grained microstructure of an average crystallite size less than 0.1 micron,
    (b) heating the metal film while monitoring the fine-grained microstructure,
    (c) stopping the step of heating when the fine-grained microstructure changes to a second microstructure having a second type of grain of an average crystallite size greater than 0.1 micron and less than 1.0 micron, and (d) freezing the second microstructure at a temperature not greater than −20° C., wherein the second microstructure is stabilized for the entire freezing period.

9. The process of claim 8 wherein freezing the second microstructure includes freezing the second microstructure for at least a 24-hour interval.

* * * * *